US009607833B2

(12) United States Patent
Chien et al.

(10) Patent No.: US 9,607,833 B2
(45) Date of Patent: Mar. 28, 2017

(54) SYSTEM AND METHOD FOR PHOTOMASK PARTICLE DETECTION

(71) Applicant: TAIWAN SEMICONDUCTOR MANUFACTURING COMPANY, LTD., Hsin-Chu (TW)

(72) Inventors: Shang-Chieh Chien, New Taipei (TW); Shu-Hao Chang, Taipei (TW); Hsiang-Yu Chou, Taipei (TW); Kuo-Chang Kau, Yuanli Township, Miaoli County (TW); Shun-Der Wu, Tainan (TW); Chia-Chen Chen, Hsinchu (TW); Jeng-Horng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/610,455

(22) Filed: Jan. 30, 2015

(65) Prior Publication Data
US 2016/0225610 A1    Aug. 4, 2016

(51) Int. Cl.
*H01L 21/027* (2006.01)
*G03F 7/20* (2006.01)
*H01L 21/66* (2006.01)

(52) U.S. Cl.
CPC ...... *H01L 21/0274* (2013.01); *G03F 7/70033* (2013.01); *H01L 22/12* (2013.01)

(58) Field of Classification Search
CPC ....... H01L 21/0274; H01L 22/12; G03F 7/20; G03F 7/70033
See application file for complete search history.

(56) References Cited

U.S. PATENT DOCUMENTS

| 6,982,133 | B2 | 1/2006 | Chandhok et al. | |
| 8,692,193 | B2 | 4/2014 | Kuan et al. | |
| 2005/0275835 | A1 | 12/2005 | Sogard | |
| 2007/0013892 | A1* | 1/2007 | Osawa | G03F 1/82 355/71 |
| 2013/0313423 | A1* | 11/2013 | Umstadter | H05G 2/003 250/282 |
| 2014/0199543 | A1 | 7/2014 | Ehm et al. | |

OTHER PUBLICATIONS

Yen-Cheng Lu, "Extreme Ultraviolet Lithography Process to Print Low Pattern Density Features," U.S. Appl. No. 61/898,348, filed Oct. 31, 2013, 42 Pages.

* cited by examiner

*Primary Examiner* — Michelle Mandala
(74) *Attorney, Agent, or Firm* — Haynes and Boone, LLP

(57) ABSTRACT

The method includes performing a photolithography process which includes using a photomask to pattern a radiation beam. The photolithography process also includes exposing a target substrate to the patterned radiation beam. During the exposing of the target surface, there is a real-time monitoring for particles incident or approximate the photomask.

19 Claims, 8 Drawing Sheets

SYSTEM AND METHOD FOR PHOTOMASK PARTICLE DETECTION

BACKGROUND

A lithography process is typically used in a semiconductor device fabrication process whereby the lithography process transfers patterns of photomasks (also referred to as reticles or simply, masks) to a target substrate, typically a semiconductor substrate having a photosensitive layer disposed thereon. If the mask has a defect, the defect is likewise transferred to the target substrate as a defect in the pattern developed onto the substrate. The defect may produce yield, quality, or reliability issues for the formed semiconductor devices.

As technology nodes shrink, the lithography techniques likewise are required to provide higher and higher precision for accurate reproduction of features of a photomask onto a target substrate. One lithography technique in development is extreme ultraviolet (EUV). One challenge of EUV is providing and maintaining reticle quality. Because of the wavelength of radiation used, reduction of particles on the mask becomes more critical but conventional methods, such as pellicle films uses in deep ultraviolet (DUV) processes may become disadvantageous.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
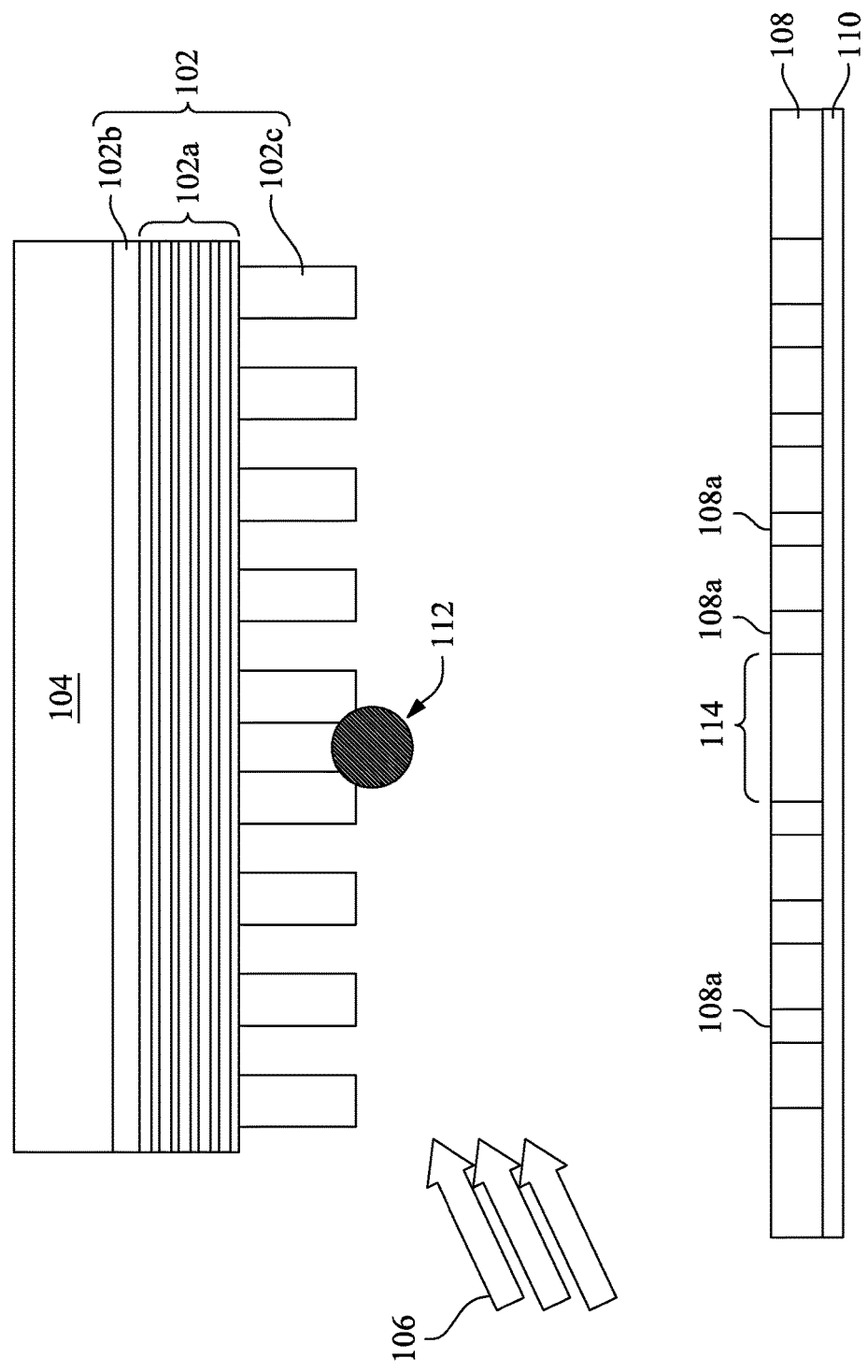
FIG. 1 in a schematic diagram illustrating a photomask having a particle providing inaccurate reproduction of the desired pattern on a target substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, illustrated is a photomask or reticle 102. In an embodiment, the photomask 102 is a patterned reflective mask used for EUV lithography. Typically an EUV photomask such as mask 102 includes a multi-layer film stack 102a deposited on a substrate 102b such as a low-thermal expansion material (LTEM) substrate. The multi-layer film 102a may be selected such that it provides a high reflectivity to a selected radiation type and/or wavelength using in the associated lithography process. In a typical example, the number of the film pairs in the multi-layer film 102a ranges from 20 to 80, however any number of film pairs is possible. As one example, about 40 to 50 alternating layers of silicon and molybdenum are typically formed on a substrate and act to reflect the radiation. Alternatively, the multi-layer film 102a may include molybdenum-beryllium (Mo/Be) film pairs, or any suitable material that is highly reflective at given wavelengths. The thickness of each layer of the multi-layer film 102a depends on the given wavelength. The incident angle may be adjusted to achieve a maximum constructive interference of the radiation reflected at each interface and a minimum absorption of the radiation by the multi-layer film 102a.

The LTEM material of the substrate 102b may include $TiO_2$, doped $SiO_2$, or other low thermal expansion materials with low thermal expansion properties. A patterned film 102c may be disposed on the multi-layer film 102a in order to pattern the incident radiation beam. The patterned film 102c may provide for an absorption material and/or a phase shift material to the incident radiation relative to the reflective incident radiation from the multilayer 102a. The patterned film 102c may define main features to be imaged onto a target substrate and define a semiconductor device or portion thereof, such as, for example, contacts, gate structures, interconnect lines, vias, and the like. In an embodiment, the film 102c is tantalum nitride. However, other exemplary film 102c compositions include tantalum boron nitride, tantalum boron oxide, chromium, chromium oxide, titanium nitride, tantalum, titanium, or aluminum-copper chromium, including nitrides, oxides, and alloys of each. The film 102c may include multiple layers.

Additional layers may also be provided in the photomask 102. For example, a capping layer may be formed above the multilayer 102a to function as an etch stop layer in a patterning process or other operations, such as repairing or cleaning or to prevent oxidation. The capping layer may include ruthenium (Ru) or Ru compounds such as RuB, RuSi, chromium (Cr), Cr oxide, or Cr nitride.

FIG. 1 illustrates the photomask 102 held by a chuck 104, such as is typical in EUV systems. In an embodiment, the chuck 104 is an electrostatic chuck. In an embodiment, a conductive layer may be additionally disposed on back surface of the mask substrate 102b for the electrostatic chucking purpose. In one example, the conductive layer includes chromium nitride (CrN), though other compositions are possible.

Each of the layers of the photomask 102 may be formed by various methods, including physical vapor deposition (PVD) process, a plating process, a chemical vapor deposition (CVD) process, ion beam deposition, spin-on coating, metal-organic decomposition (MOD), and/or other methods known in the art.

The photomask 102 is used to pattern a radiation beam 106 in order to expose a photosensitive layer 108 disposed on a target substrate 110 to a pattern defined by the photomask 102. FIG. 1 illustrates a pattern defining regions 108a of the photosensitive layer 108. On account of a particle 112 on the photomask 102, the pattern defined by the film 102c is not accurately reproduced in the photosensitive layer 108. Thus, the particle 112 creates a defect region 114 on the target substrate 110.

In order to avoid or mitigate the exposure of a target substrate to produce a pattern that does not accurately represent that formed on the photomask, it necessary to recognize particles, such as particles 112, are incident or soon to be incident on the photomask and allow for their removal prior to exposure of the target substrate and/or subsequent substrates. One or more embodiments discussed below may provide for this. It is noted that while FIG. 1 and the accompany description above illustrate a photomask and system for EUV lithography, the present disclosure is not so limited except where specifically recited in the claims that follow. Rather one of ordinary skill would understand the systems and methods disclosed herein apply to various lithography systems, methods, and photomasks.

Figure 2:
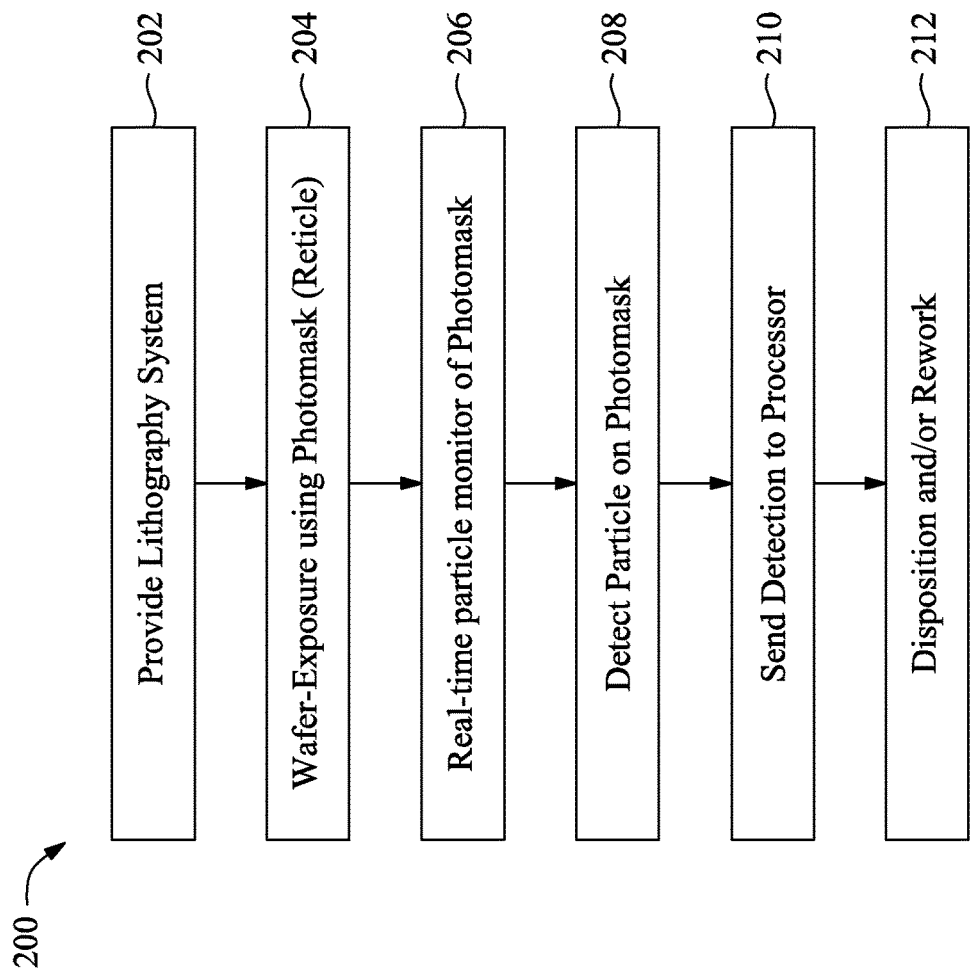
FIG. 2 is a flow chart illustrating a method of lithography in accordance with some embodiments.

Referring now to FIG. 2, illustrated is a method 200 for performing a lithography process including a real-time particle monitor according to one or more aspects of the present disclosure. The method 200 of FIG. 2 may be used to identify a particle and/or classify a particle on or adjacent a photomask used in the lithography process. Classifying a particle includes determining its composition, its size, its shape, and, its location on the photomask, and/or other features of the particle. Examples of the method 200 may apply to EUV lithography processes, deep UV (DUV) lithography processes, x-ray (e.g., soft x-ray) lithography processes, and/or other lithography process now known or later developed.

The method 200 begins at block 202 where a lithography system is provided. In an embodiment, the lithography system is an EUV system operable to expose a pattern on a target substrate or wafer using a radiation source in the EUV range. One example of a lithography system provided in block 202 is illustrated in FIG. 3 and described in detail below.

Figure 3:
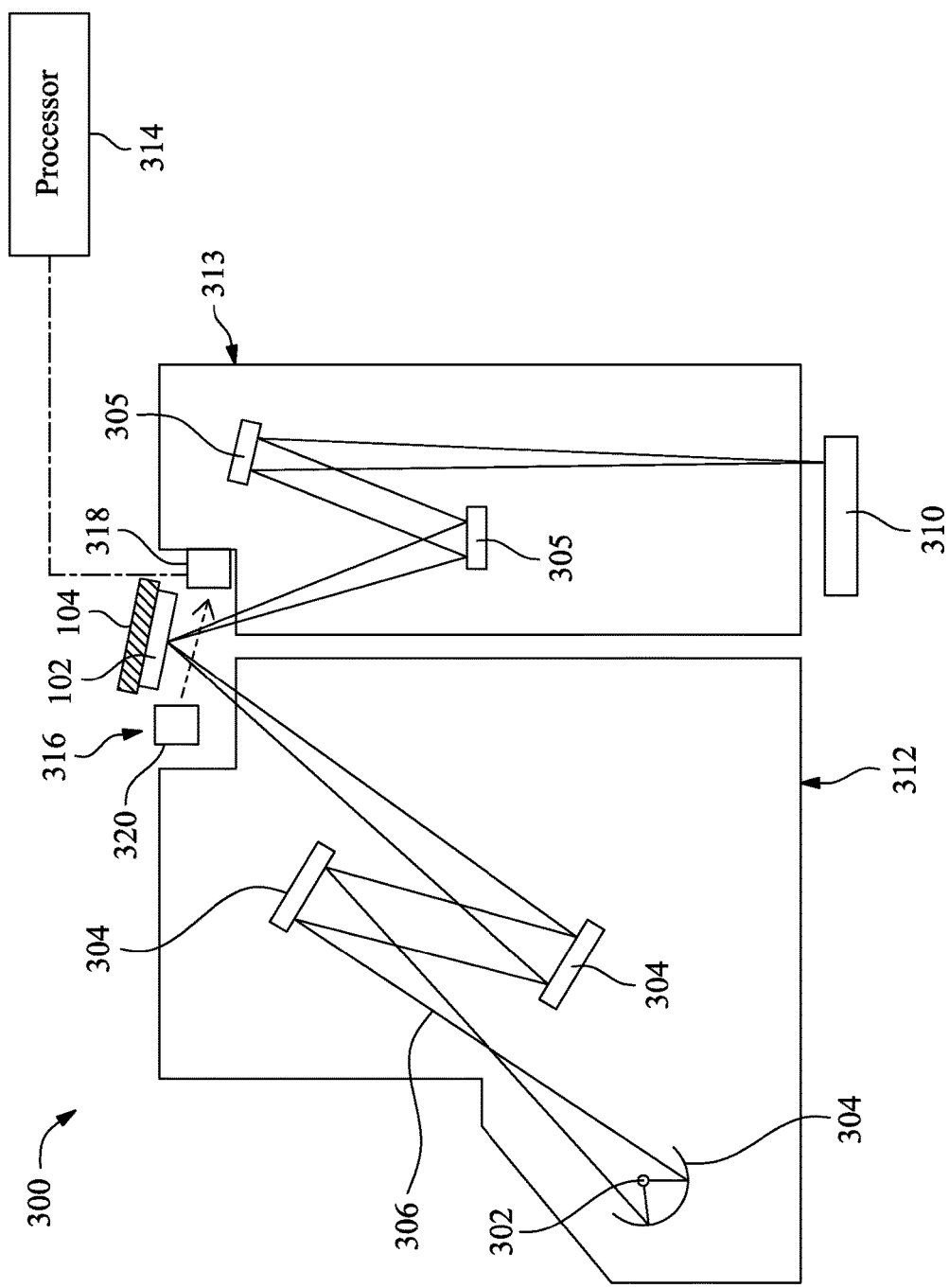
FIG. 3 is a schematic diagram illustrating a lithography system in accordance with some embodiments.

FIG. 3 is a schematic diagram illustrating a lithography system 300 in accordance with some embodiments. The lithography system has an illumination system 312 and a projection system 313. In an embodiment, the lithography system 300 is an extreme ultraviolet (EUV) system including as described below. Other examples of lithography system 300 include those operable to perform soft X-ray (SX) wavelength, deep ultraviolet (DUV) wavelength, and/or other lithography processes now known or later developed. Components of the lithography system 300 are operated under vacuum conditions.

A radiation source 302 is provided in the illumination system 312 of the lithography system 300. In an embodiment, the radiation source 302 is a plasma source. Laser induced and electrical discharge gas plasmas are also available sources. Exemplary plasma sources include xenon, oxygen, and lithium sources. As illustrated in FIG. 3, a radiation beam 306 is provided by the radiation source 302.

The radiation source 302 may be operable to produce EUV radiation, such as radiation having a wavelength ranging from about 1 nm to about 100 nm. In an embodiment, the emitted radiation beam 306 may have a wavelength of approximately 5 nanometers (nm) to approximately 20 nm, however, other wavelengths are possible. In one particular example, the EUV radiation source 302 generates a EUV radiation beam 306 with a wavelength centered at about 13.5 nm.

In various embodiments, the illuminator system 312 includes various refractive optic components, such as a single lens or a lens system having multiple lenses (zone plates) or reflective optics, such as a single mirror or a mirror system having multiple mirrors in order to direct light from the radiation source 302 onto a mask 102. In an embodiment where the radiation source 302 that generates radiation in the EUV wavelength range, reflective optics are employed.

In the illustrated embodiment of FIG. 3, the lithography system 300 has a plurality of mirrors 304 in the illumination system 312. The mirrors 304 direct the beam 306 to the photomask 102, which has the pattern to be imaged on a target substrate 310 substantially similar to as discussed above. The quantity and configuration of the mirrors 304 is exemplary only. In other embodiments, refractive optics can also be realized by zoneplates for example. In an embodiment, the illuminator system 312 is operable to configure the mirrors 304 to provide an off-axis illumination (OAI) to illuminate the mask 102. In one example, the mirrors 304 of the illuminator system 312 are switchable to reflect EUV radiation to different illumination positions. In another embodiment, a stage prior to the illuminator system 312 may additionally include other switchable mirrors that are controllable to direct the EUV light to different illumination positions with the mirrors of the illuminator system 312.

The projection system 313 includes mirrors 305 that are used to project the beam 306, after patterning by the photomask 102, onto the target substrate 310. Again, the mirrors 305 are exemplary only and not intended to be limiting. In embodiments, the projection system 313 may include additional mirrors.

In an embodiment, the photomask 102 is a reflective mask (or reticle) such as provided in an EUV lithography system. The mask 102 illustrated in FIG. 3 may be substantially similar to the mask 102, described above with reference to FIG. 1. In other embodiments, the mask 102 may be a through-the-mask reticle or photomask. In some embodiments, the mask 102 is held by a chuck 104, again such as described above with reference to FIG. 1.

In an embodiment, the mask 102 does not have a pellicle formed thereon. A pellicle is a thin film on a frame which covers a patterned surface of the photomask. Pellicles may be disadvantageous for some embodiments of lithography including some embodiments using EUV radiation. For example, because of high absorption of the EUV by the pellicle, heat affects may be disadvantageous.

The target substrate 310 includes a photosensitive layer disposed thereon. The target substrate 310 may be a silicon wafer. The substrate 310 may also include other elementary semiconductors such as germanium and diamond. Alternatively, the substrate 210 may include a compound semiconductor and/or an alloy semiconductor. Further, the substrate 310 may optionally include an epitaxial layer (epi layer), may be strained for performance enhancement, may include a silicon-on-insulator (SOI) structure, and/or have other suitable enhancement features. The target substrate 310 may include a plurality of die formed or partially formed thereon. The die may include any number of semiconductor devices, such as field effect transistors (FETs), capacitors, resistors, conductive interconnects, and/or other suitable devices. The target substrate 310 may include various doped regions or regions of the substrate (including layers on semiconductor wafer) with suitable N-type or P-type dopants (impurities). Exemplary regions include active regions on which MOS devices can be formed; the active regions may be doped to form well regions. The doped regions, including but not limited to active regions, may vary in dimension, dopant level, configuration, and/or other properties. The boundaries of the active regions may be defined by isolation structures such as shallow trench isolation (STI) features.

The lithography system 300 also includes and/or is in communication with an information handing system having a processor 314. In an embodiment, the processor 314 includes functionality providing for receiving information from a particle monitor 316 of the system 300 and/or providing appropriate action including as described in the method 200 of FIG. 2.

The information handling system including the processor 314 may include a storage device such as a floppy drive, hard drive, CD-ROM, optical device or any other storage device. In addition, the storage device may be capable of receiving a floppy disk, CD-ROM, DVD-ROM, or any other form of computer-readable medium that may contain computer-executable instructions. The processor 314 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In addition, software encompasses any set of instructions capable of being executed in a client machine or server. Any combination of hardware and software may comprise a computer system including a processor. The codes, executed by a computer, may include code for determining defects, generating reticle defect maps, and/or other functionality of the method 200.

Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

The lithography system 300 also includes a particle monitor system 316 in accordance with some embodiments. The particle monitor system 316 is operable to monitor for the presence of particles on or near the photomask 102. The particle monitor system 316 may identify particles that have an interface with a surface of the photomask 102. The particle monitor system 316 may identify particles in the ambient conditions adjacent the photomask 102. In an embodiment, the particle monitor system 316 identifies particles near the surface and having a trajectory such that they will become incident the photomask surface. In an embodiment, the particle monitor system 316 identifies particles approximately 10 mm or less away from the photomask 102 surface. In a further embodiment, the particle monitor system 316 identifies particles approximately 1 mm or less away from the photomask 102 surface.

In an embodiment, the particle monitor system 316 is in communication with the processor 314 and communicates data indicating the presence of a particle to the processor 314. The particle monitor system 316 may be operable to detect particles of any size including those in a nanometer scale (e.g., 100 nanometers or less).

The particle monitor system 316 includes a light source(s) 320 and a sensor 318. In an embodiment, the sensor 318 is an optical sensor. The constructive or destructive interference of a light beam(s) projected from the light source(s) 320 to the optical sensor(s) 318 can be used to determine that a particle is present between the source(s) 320 and sensor(s) 318. Specifically, particles in the system are hit with the light from the light source(s) 320 and each of the particles diffracts the light in various directions. The diffracted light from the particle can either interfere constructively (light regions) or destructively (dark regions). From this interference data, the particle is identified and/or classified as discussed herein. The particle monitor system 316 is discussed in further detail herein including with reference to FIGS. 4, 5, 6, and 7.

In an embodiment, the particle monitor system 316 is in communication with the processor 314 and communicates data that may be used to determine the presence and the classification of a particle to the controller 314. The classification of the particle that may be determined includes the particle size, the particle shape, the particle location (with reference to the photomask or patterned formed thereon), the particle composition, and/or other particle features. The constructive or destructive interference (or energy loss or gain) determined by the optical sensor(s) 318 of the particle monitor system 316 may be communicated to the processor 314. The determination of the presence and/or classification of the particle is discussed in further detail below. Again, the particle monitor system 316 is discussed in further detail herein including with reference to FIGS. 4, 5, 6, and 7.

Referring again to FIG. 2, the method 200 then proceeds to block 204 where a target substrate is exposed using a photomask and the provided lithography system. The lithography process is substantially as discussed above with reference to FIGS. 1 and 3.

In an embodiment, the target substrate is exposed using an EUV radiation, such as radiation having a wavelength ranging from about 1 nm to about 100 nm. In an embodiment, the exposure uses a radiation wavelength of approximately 5 nanometers (nm) to approximately 20 nm, however, other wavelengths are possible. In one particular example, the exposure uses beams with a wavelength centered at about 13.5 nm. In other embodiments, the exposure may include radiation of a soft X-ray (SX) wavelength, deep ultraviolet (DUV) wavelength, and/or other radiation of lithography processes now known or later developed.

During, before, and/or after the exposure of the photomask to the radiation, a real-time monitor of the reticle or photomask for incident (or near) particles is performed as illustrated in block 206. The real-time monitor of the photomask is performed by providing a light beam adjacent the surface of the photomask. In an embodiment, the light beam provides a contiguous "curtain" of light adjacent the surface of the photomask and extending across the dimensions (width and length) of the photomask. The light beam, such as a curtain, is adjacent the surface of the photomask to which the radiation beam will be incident. In an embodiment, the light beam is adjacent the patterned surface of the photomask. A constructive and/or destructive interference of the light beam is sensed by one or more optical sensors near the edges of the photomask by identifying an energy change or intensity change of the light beam. The constructive or destructive inference indicates an interference with the light beam or curtain caused by the presence of a particle between the sensor and the light source. The light beam may be "on" and the sensor active during the exposure of the photomask to the suitable radiation (e.g., EUV radiation beam). Thus, real-time monitoring is provided during the exposure process.

The particles detected by the particle monitor system using the real-time monitor of the photomask may be generated during reticle clamping, generated during the EUV process, and/or generated other times during, before and after the lithography process. In an embodiment, the particle is tin (Sn). The Sn particle can originate from the Sn used to generate the radiation beam.

The particle monitor system used for the real-time monitor of block 206 may include an optical sensor, such as optical sensor(s) 318, and a radiation or light source(s), such as light source 320, described above with reference to FIG. 3. The constructive or destructive interference of a light beam(s) projected from the light source(s) to the optical sensor(s) can be used to determine that a particle is present between the source(s) and sensor(s). Specifically, particles in the system are hit with the radiation/light from the light source(s) and each of the particles diffracts the light in various directions. The diffracted light from the particle can either interfere constructively (light regions) or destructively (dark regions). The particle monitor system is discussed in further detail herein including with reference to FIGS. 4, 5, 6, and 7.

In an embodiment, the particle monitor system and/or block 206 uses dynamic light scatter (DLS) technology to detect particles, including nano-scale particles. The DLS technology may be operable to provide data useful in determining the particle size, shape, location, and/or composition based on the constructive and destructive interference. The constructive or destructive interference (or energy loss) determined by the optical sensor(s) 318 of the particle monitor system 316 may be communicated to the processor 314.

The method 200 then proceeds to block 208 where a particle is detected by the real-time particle monitor. The particle may be on and/or adjacent the photomask. One example of a particle that may be detected is described and illustrated above with reference to FIG. 1 and the particle 112. Any number of particles may be detected in block 208.

In an embodiment, the detection of the particle in block 208 includes detecting a constructive and/or destructive interference using a sensor such as the optical sensor 318. The detection of constructive/destructive interference may be sensed by determining an intensity or energy change of the light and/or a position of the intensity or energy loss/gate and may be transmitted to an information handling system, such as the processor 314 described above with reference to FIG. 3, as illustrated in block 210.

The information handling system may then use the data from the sensor, as discussed with reference to the system 316, to determine the size, shape, and/or position of the particle. In an embodiment, constructive/destructive interference by the particle provides a change in intensity (energy) in the light sensed by a region of the sensors. The change in intensity and the area over which the intensity is varied may be used to determine the position of the particle on the photomask. The change in intensity and the area over which the intensity is varied may determine the shape of the particle. The change in intensity and the area over which the intensity is varied may determine the size of the particle. Intensity fluctuation can also be used to determine the time scale of movement of a particle.

In a further embodiment, the processor may also determine the composition of the particle from the data from the sensor. The composition of the particle may be determined using a reflectivity of the particle. For example, in an embodiment, a reflectivity of a known composition (e.g., tin) may be used to determine a particle's composition. In an embodiment, the spectrum of the detected light may be used to determine the composition of a particle.

The method 200 then proceeds to block 212 where a disposition and/or rework operation is performed. In an embodiment in block 212, it is determined to remove the particle through cleaning procedures. Thus, the lithography process may be stopped, and the cleaning process performed. Before continuing the lithography process, the particle monitoring of block 206 may be performed again.

In an embodiment in block 212 it is determined that the particle is of a size and/or at a position such that the exposure process can continue with the particle as is.

In an embodiment in block 212, the target substrate is dispositioned such as, for example, when the detection of the particle indicates the target substrate has been exposed while the particle was on (or adjacent to) the photomask. In a further embodiment, the target substrate is reworked. For example, the photosensitive material is stripped and the lithography exposure performed again. In another embodiment, the target substrate is continued to development.

Figure 8:
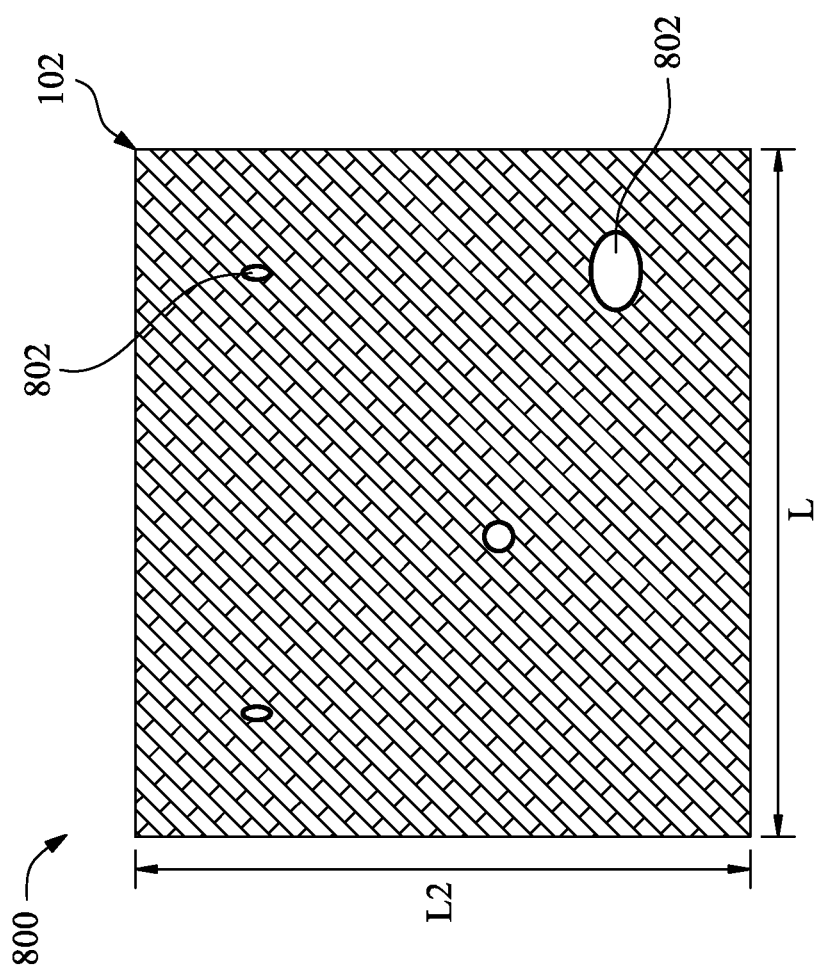
FIG. 8 illustrates a diagrammatic top down view of an embodiment of a reticle or representation of reticle as a reticle map in accordance with some embodiments.

In an embodiment, in block 212 a reticle map is generated. The reticle map may be substantially similar to the reticle map 800, described below with reference to FIG. 8. In an embodiment, the reticle map is stored in the information handing system that includes a processor such as described above with reference the system 300 and FIG. 3. The reticle map indicates where a particle is positioned on the photomask. In an embodiment, the reticle map also indicates a size of a particle positioned on the photomask. The reticle map may be used to determine the deposition of the substrate and/or photomask as discussed above.

Referring now to FIGS. 4, 5, 6, and 7, illustrated is the particle monitor system 316 in greater detail. The particle monitor system 316 may be used in a lithography system, such as the lithography system 300, described above with reference to FIG. 3. In another embodiment, the particle monitor system 316 may be used to perform one or more steps of the method 200 including blocks 206, 208, and 210.

Figure 4:
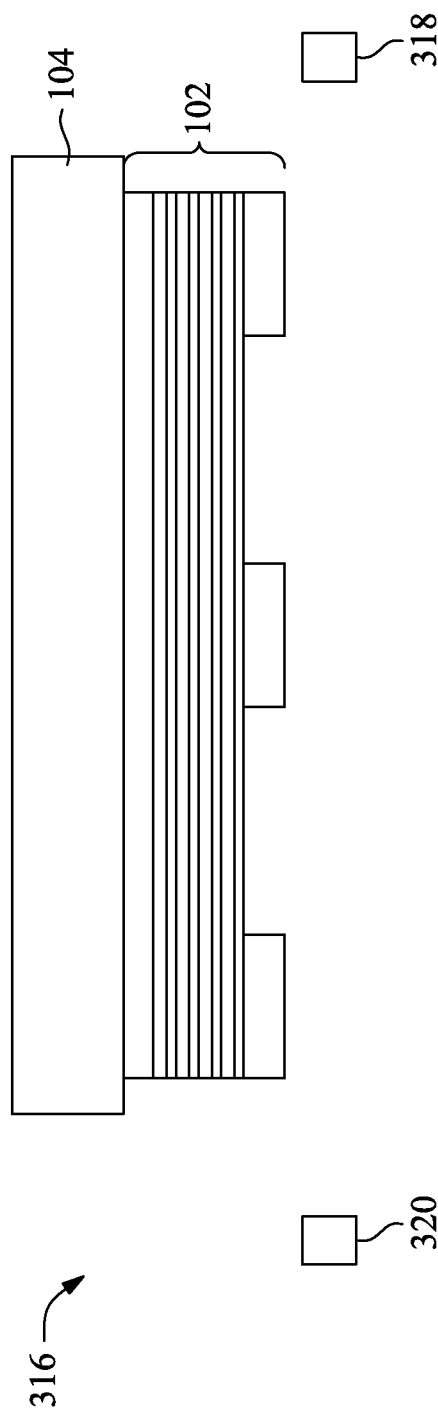
FIGS. 4, 5, 6, and 7 illustrate embodiments of a system for particle detection in accordance with some embodiments.

FIG. 4 illustrates the particle monitor system 316 having the light source 320 and the sensor 318. The sensor 318 may be an optical sensor. The optical sensor 318 may be a sensor suitable for detecting an intensity or energy of a light beam. In an embodiment, the optical sensor 318 includes a CMOS-image sensor (CIS). The optical sensor 318 may include a plurality of contiguous sensors operable to sense light across the dimensions of the photomask. The light source 320 may be any source operable to produce a wavelength of between approximately 400 nanometers to approximately 100 nanometers. In a further embodiment, the light source 320 provides beam(s) having a wavelength of approximately 200 nanometers.

FIG. 4 also illustrates the photomask 102 held by the chuck 104. The photomask 102 and/or chuck 104 may be substantially similar to as discussed above with reference to FIGS. 1, 2, and/or 3. As illustrated in FIG. 4, the light source 320 may be adjacent and outside of an edge of the photomask 102. The sensor 318 may be adjacent and outside of an opposing edge of the photomask 102. As such, the light source 320 provides a light beam across an entirety of a surface of the photomask 102 as illustrated in FIGS. 5 and 6.

Figure 5:
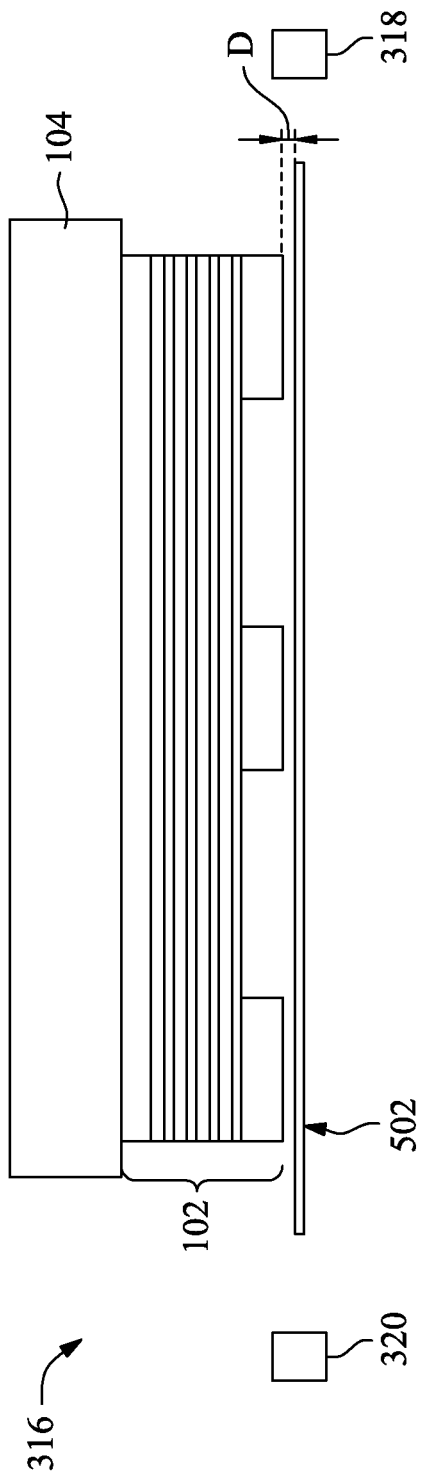

FIG. 5 illustrates a cross-sectional schematic view of the particle monitor system 316 having the light source 320 turned "on" producing beam(s) 502. The beams 502 may cover the dimension (length/width) of the photomask 102. The distance D of the beam(s) 502 to a surface of the photomask 102 may be between approximately 10 millimeters (mm) to approximately 1 mm. However, other distances are possible. The positioning of the beam 502 may be determined based on the respective topography of the photomask 102, for example, the pattern of film 102c.

Figure 6:
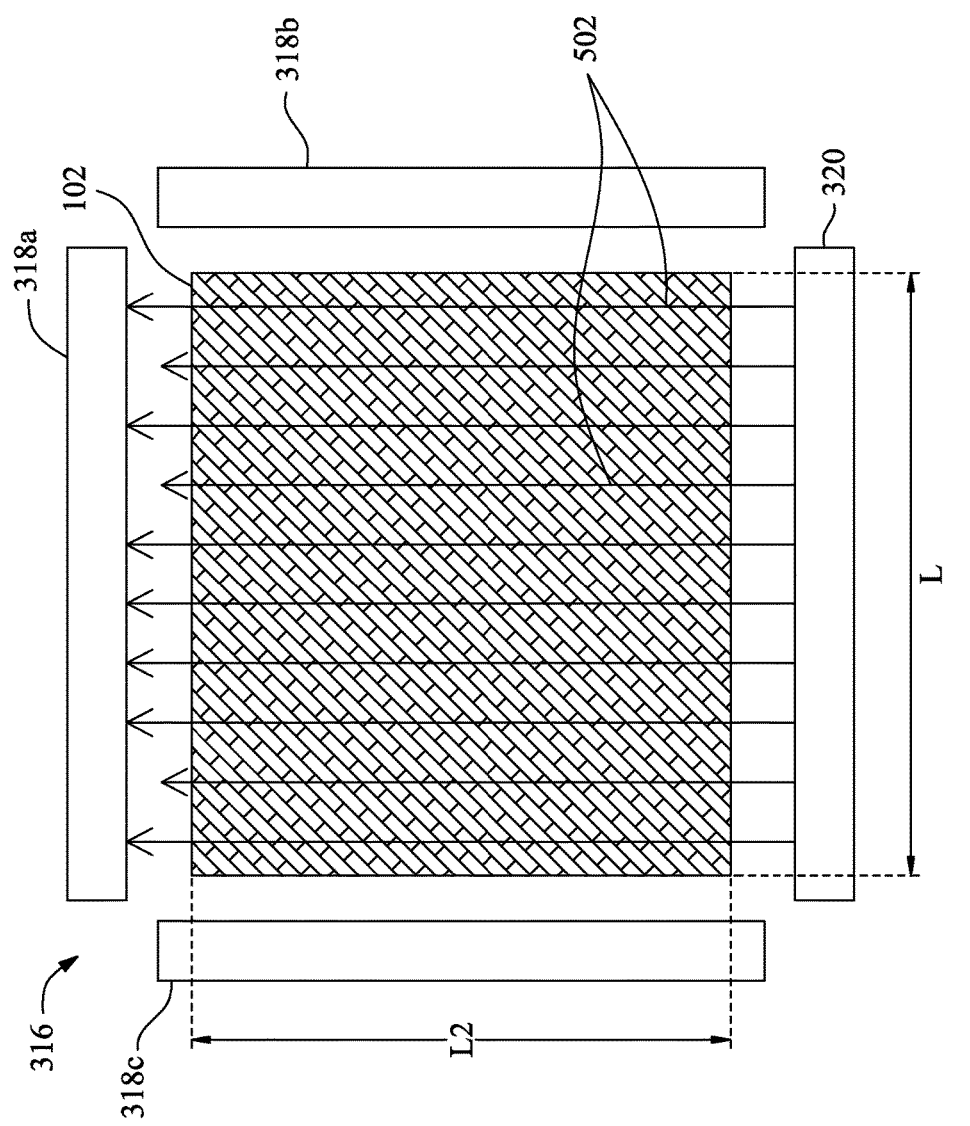

FIG. 6 is illustrates a top schematic view of the particle monitor system 316 having the light source 320 turned on producing beam(s) 502. The beam(s) 502 may also be referred to as providing a "curtain" of light across the photomask 102 or a contiguous beam(s) of light traversing the length (L) of the photomask 102. In the embodiment of FIG. 6, three sets of detectors 318 are illustrated. A first detector 318a is disposed directly across the photomask 102 from the light source 320. In other words, the first detector 318a is adjacent an opposing side of the photomask 102 from the light source 320. The first detector 318a may include CIS. The first detector 318a may be a bright field detector. The first detector 318a may receive the beam 502. In an embodiment, the first detector 318a detects the beam 502 having an energy loss or decrease in intensity. The energy loss may indicate a particle is intercepting or interfering with the beam 502 between the light source 320 and the detector 318a. The change in intensity or energy loss detected by the first detector 318a may provide data for determining not only the presence of a particle, but its shape, size, and/or composition. In an embodiment, the first detector 318a is the only detector in the particle detection system 312.

A second detector 318b and a third detector 318c may be disposed perpendicular to the light source 320 and traversing the length L2 of the edges of the photomask 102. In other words, the second detector 318b is disposed adjacent and spaced a distance from an edge that is transverse to the first edge having detector 318a. The third detector 318c is disposed adjacent and spaced a distance from an edge that is transverse to the first edge having detector 318a and opposing the edge associated with the second detector 318b. The second and/or third detectors 318b/c may include CIS. The second and/or third detectors 318b/c may be dark field detectors. As discussed above, the first detector 318a may receive the beam 502. However, should a particle be in the path between the light source 320 and the first detector 318a, the beam 502 will be deflected or scattered. The reflected or scattered light may be sensed by the second and/or third detector 318b/c. Thus, the second or third detector 318b/c in a given (e.g., particle free) state may provide a baseline of no or little detection of light or energy, while the detection of light or energy by the second or third detector 318b/c indicates a particle's presence causing scattering light to be detected by the second and/or third detector 318b/c. The second and/or third detector 318b/c may be higher in sensitivity than the first detector 318a. The change in intensity detected by the second and/or third detector 318b/c may provide data for determining not only the presence of a particle, but its shape, size, and/or composition. In some embodiments, the second or third detector 318b/c are omitted.

Figure 7:
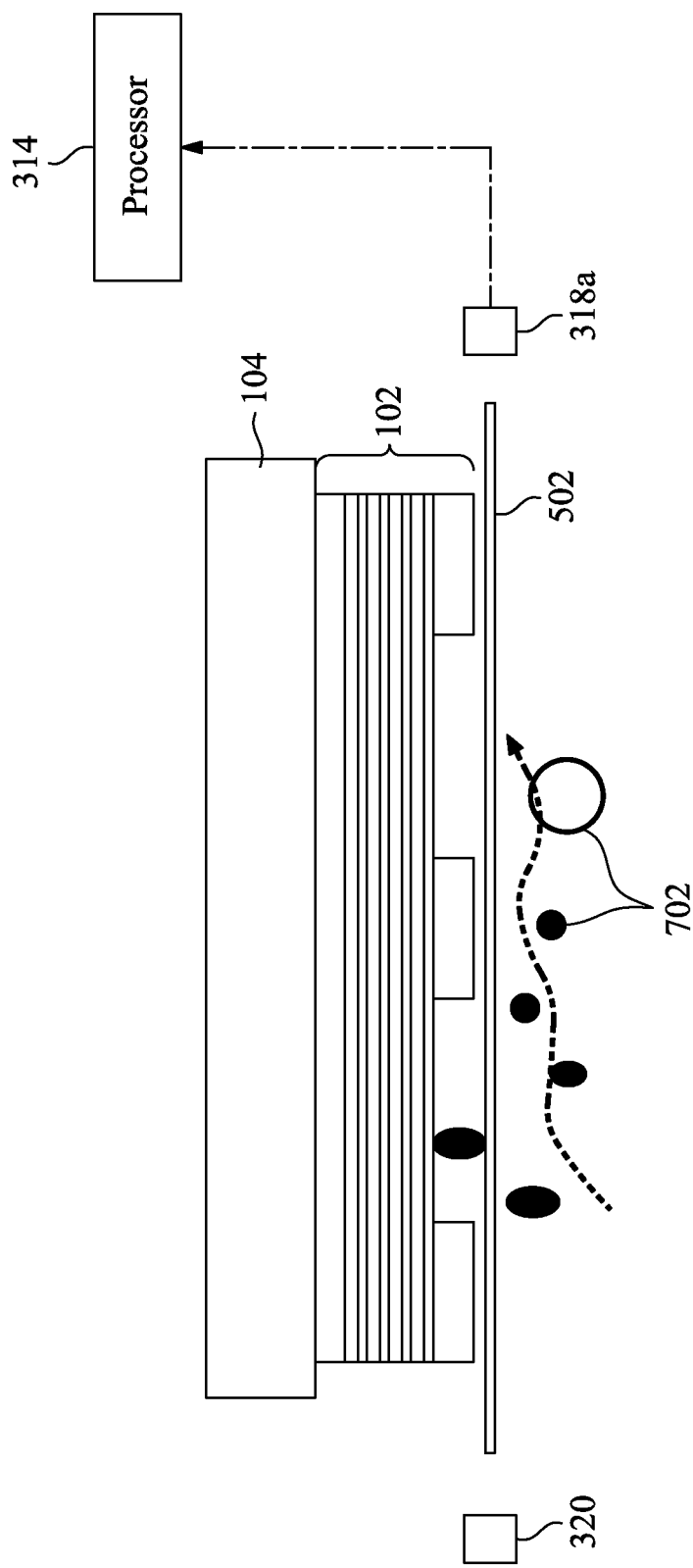

FIG. 7 is illustrative of the particle detection system 316 having particles 702 on and adjacent the photomask 102. More of more of the particles 702 intercept the beam 502 between the light source 320 and the detector 318. In an embodiment, the detector 318 is substantially similar to the detector 318a. In an embodiment, the detector 318 of FIG. 7 is a bright field detector. Thus, the detector 318 detects an energy loss from the interception of the beam 502 prior to being incident the detector 318. This detected energy loss is communicated to an information handling system, including processor 314.

Referring again to FIG. 8, illustrated is a reticle map 800. The reticle map 800 may be created by a processor using data obtained from the sensor of the defect detection system such as discussed above with reference to FIG. 2. The reticle map 800 may be stored on a computer readable medium of an information handling system including the processor. The reticle map 800 includes a representation of a reticle, such as reticle 102 having size L, L2, as illustrated in FIG. 6. The reticle map 800 includes a graphical representation of particles 802 having a determined size and location on the reticle. The determined size and reticle may be obtained using the systems and methods discussed herein.

Thus, one will appreciate systems and methods are described that allow for real-time monitoring of particles on a photomask in a lithography system. The sensors allow for capability to not only detect a particle, but determine its location, size, and other properties. The real-time monitoring in embodiments allows for an earlier determination of a particle adder rather than waiting for a determination that a defect has been generated on a processed (e.g., exposed) wafer. The real-time monitoring in embodiments also allows for an improvement in yield as particles are detected prior to processing a wafer with the photomask having the defect. Thus, embodiments of the present disclosure can save time, resources, yield, and process throughput. Embodiments of the present disclosure also provide for photomask review, which do not rely on manual, visual inspection. In some embodiments, the method and systems of particle detection described herein provide for a photomask that does not require a pellicle, but still allows identification and control of "fall-on" particles.

Thus, it will be appreciated that provide in one of the broader forms is a method of fabricating a semiconductor device. The method includes performing a photolithography process which includes using a photomask to pattern a radiation beam. The photolithography process also includes exposing a target substrate to the patterned radiation beam. During the exposing of the target surface, there is a monitoring for particles on the photomask.

In another of the broader forms, a method of fabricating a semiconductor device includes providing a photomask having patterned surface and defined by a first, second, third and fourth edges. A light source is positioned adjacent the first edge of the photomask and adjacent and spaced a distance from the patterned surface of the photomask. An optical detector is positioned adjacent the second edge of the photomask. A light beam is sent from the light source to the optical detector. The optical detector is used to determine an energy loss of the light beam between the light source and the optical detector. In an embodiment, the energy loss is due to a particle interfering with the light beam (e.g., curtain).

In another embodiment, a system is described that includes a chuck operable to hold a photomask. A light source is adjacent a first edge of the photomask and spaced a distance from a patterned surface of the photomask. An optical detector is adjacent a second edge of the photomask.

A processor is coupled to the optical detector and capable of determining an energy loss of light traversing from the light source to the optical detector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
    performing a photolithography process, wherein the performing the photolithography process includes:
    using a photomask to pattern a radiation beam;
    exposing a target substrate to the patterned radiation beam; and
    during the exposing the target substrate, monitoring for particles on the photomask by sending a light beam from a light source to a detector and detecting a change in intensity of the light beam using the detector.

2. The method of claim 1, wherein the detecting the change in intensity of the light beam is performed on the light beam traversing a region adjacent the photomask surface.

3. The method of claim 1, wherein the monitoring for particles includes
    sending an intensity of the light beam detected at the detector to a processor to perform the detecting the change in intensity.

4. The method of claim 3, further comprising:
    determining a size of a particle using the sent intensity of the light beam.

5. The method of claim 2, further comprising:
    determining a position of a particle on the photomask using the change in intensity of the light beam.

6. The method of claim 1, further comprising:
    providing a particle monitor including the light source and the detector of at least one dark field detector and at least one bright field detector.

7. The method of claim 1, wherein the exposing the target surface includes using a radiation beam having a wavelength in an extreme ultraviolet (EUV) range.

8. A method of fabricating a semiconductor device, comprising:
    providing a photomask having patterned surface and defined by a first, second, third and fourth edges;
    positioning a light source adjacent the first edge of the photomask and adjacent and spaced a distance from the patterned surface of the photomask;
    positioning an optical detector adjacent the second edge of the photomask;
    sending a light beam from the light source to the optical detector; and
    using the optical detector to determine an energy loss of the light beam between the light source and the optical detector.

9. The method of claim 8, wherein the second edge is an opposing edge of the photomask to the first edge.

10. The method of claim 8, wherein the light beam extends over the first, second, third and fourth edges.

11. The method of claim 8, further comprising:
    providing a radiation beam to the patterned surface of the photomask;
    reflecting the radiation beam from the patterned surface; and
    using the reflected beam to pattern a photosensitive layer disposed on a semiconductor substrate.

12. The method of claim 11, wherein the providing the radiation beam and the sending the light beam are concurrent.

13. The method of claim 8, further comprising:
    using a second optical detector to determine an occurrence of energy from a reflection of the light beam off a particle disposed between the light source and the optical detector.

14. The method of claim 8, further comprising:
    using the determined energy loss to identify a particle disposed on or adjacent the patterned surface of the photomask; and
    using the determined energy loss to determine at least one of the particle's size, the particle's shape, and the particle's position.

15. A method of fabricating a semiconductor device, comprising:
    providing a photomask having patterned surface and defined by a first, second, third and fourth edges;
    positioning a light source adjacent the first edge of the photomask and adjacent and spaced a distance from the patterned surface of the photomask;
    positioning a monitor system adjacent the second edge of the photomask;
    sending a light beam from the light source to the monitor system; and
    using the monitor system to determine if a particle exists on the photomask by determining a change in intensity of the light beam.

16. The method of claim 15, wherein using the monitor system includes identifying an interference of the light beam to determine if a particle exists on the photomask.

17. The method of claim 15, wherein using the monitor system uses dynamic light scatter technology to detect particles.

18. The method of claim 15, wherein using the monitor system includes identifying an energy loss or gain of the light beam to determine if a particle exists on the photomask.

19. The method of claim 18, wherein the monitor system uses an optical sensor.

* * * * *